US009509350B1

(12) United States Patent
Magesacher et al.

(10) Patent No.: US 9,509,350 B1
(45) Date of Patent: Nov. 29, 2016

(54) DEVICES AND METHODS FOR ADAPTIVE CREST FACTOR REDUCTION IN DYNAMIC PREDISTORTION

(71) Applicant: Infineon Technologies AG, Neubiberg (DE)

(72) Inventors: Thomas Magesacher, Villach (AT); Peter Singerl, Villach (AT); Martin Mataln, Velden (AT); Christian Schuberth, Villach-Landskron (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/736,957

(22) Filed: Jun. 11, 2015

(51) Int. Cl.
*H04L 25/03* (2006.01)
*H04B 1/04* (2006.01)

(52) U.S. Cl.
CPC ..... *H04B 1/0475* (2013.01); *H04B 2001/0425* (2013.01); *H04B 2001/0433* (2013.01)

(58) Field of Classification Search
CPC ............. H04B 1/0475; H04B 2001/0433; H04B 2001/0425
See application file for complete search history.

(56) References Cited

U.S. PATENT DOCUMENTS

| 7,142,831 | B2 | 11/2006 | Anvari | |
|---|---|---|---|---|
| 8,446,979 | B1 | 5/2013 | Yee | |
| 8,639,199 | B1* | 1/2014 | Premakanthan | 455/114.3 |
| 8,948,303 | B1* | 2/2015 | Van Cai | H04L 27/2624 375/296 |
| 2004/0052314 | A1* | 3/2004 | Copeland | H04B 1/707 375/296 |
| 2008/0211583 | A1* | 9/2008 | Nguyen | H03F 1/0211 330/297 |
| 2010/0033246 | A1* | 2/2010 | Draxler | H03F 1/3247 330/149 |
| 2010/0219889 | A1* | 9/2010 | Nagatani | H03F 1/3258 330/149 |
| 2011/0009153 | A1* | 1/2011 | Chiba | H04B 1/0475 455/522 |
| 2011/0136452 | A1* | 6/2011 | Pratt | H03F 1/3241 455/127.1 |
| 2012/0321018 | A1* | 12/2012 | Chen | H03F 1/3247 375/296 |
| 2013/0072139 | A1* | 3/2013 | Kang | H04B 1/0475 455/114.3 |
| 2014/0254718 | A1* | 9/2014 | Hori | H04B 1/0475 375/296 |

OTHER PUBLICATIONS

Zhu, et al. "Open-Loop Digital Predistorter for RF Power Amplifiers Using Dynamic Deviation Reduction-Based Volterra Series." IEEE Transactions on Microwave Theory and Techniques, vol. 56, No. 7, Jul. 2008, pp. 1524-1534.
Hammi, et al. "Synergetic Crest Factor Reduction and Baseband Digital Predistortion for Adaptive 3G Doherty Power Amplifier Linearizer Design." IEEE Transactions on Microwave Theory and Techniques, vol. 56, No. 11, Nov. 2008, pp. 2602-2608.

(Continued)

*Primary Examiner* — Kenneth Lam
(74) *Attorney, Agent, or Firm* — Eschweiler & Associates, LLC

(57) ABSTRACT

A non-linear pre-distortion engine maintaining constant peak power at its output is disclosed. The engine includes a compression estimator, a crest factor reduction processor, a digital pre-distorter and a power amplifier. The compression estimator is configured to generate a compression estimate based on an input signal and a feedback signal. The feedback signal is based on an RF output signal. The crest factor reduction processor is configured to reduce a crest factor of the input signal to generate a crest factor reduced signal based on the compression estimate. The digital pre-distorter is configured to apply a pre-distortion to the crest factor reduced signal after an initial phase and generate a pre-distorted signal based on pre-distortion parameters. The power amplifier is configured to amplify the pre-distorted signal to generate the RF output signal. The operation of the chain consisting of pre-distorter and power amplifier is substantially linear and the pre-distorter maintains constant peak power at its output, which eliminates unwanted avalanche or pre-distorter blow-up issues.

12 Claims, 6 Drawing Sheets

(56) References Cited

OTHER PUBLICATIONS

Landin, et al. "Peak-Power Controlled Digital Predistorters for RF Power Amplifiers." IEEE Transactions on Microwave Theory and Techniques, vol. 60, No. 11, Nov. 2012, pp. 3582-3590.

Braithwaite, R. Neil. "A Combined Approach to Digital Predistortion and Crest Factor Reduction for the Linearization of an RF Power Amplifier." IEEE Transactions on Microwave Theory and Techniques, vol. 61, No. 1, Jan. 2013, pp. 291-302.

Mbaye, et al. "Digital Predistortion with automatic determination of the Crest Factor Reduction gain, Principle and Experimental Validation." Conference Paper, Sep. 2014, DOI: 10.13140/2.1.2187.5202.

Mbaye et al. "Combining Crest Factor Reduction and Digital Predistortion with automatic determination of the necessary Crest Factor Reduction gain." Proceedings of the 44th European Microwave Conference, Oct. 6-9, 2014, Rome, Italy, pp. 837-840.

\* cited by examiner

PEAK ESTIMATOR

200

PEAK NORMALIZER

300

DEVICES AND METHODS FOR ADAPTIVE CREST FACTOR REDUCTION IN DYNAMIC PREDISTORTION

BACKGROUND

Communication systems often use transmission signals focused around a carrier frequency of a defined channel. Information is conveyed by representing the information with a modulation based on amplitude, phase, frequency and/or combinations thereof. The information is sent by one or more signals over a band of frequencies around the carrier frequency.

A radio frequency (RF) power amplifier is often used for modulations, such as amplitude modulation. The RF power amplifier is required to operate over wide ranges of frequencies and power levels. Ideally, perfect linearity over the ranges of frequencies and power levels is desired. However, perfect linearity is impractical to realize in real systems. As a result, RF power amplifiers typically introduce unwanted distortions due to their non linearity. These distortions degrade communications and impact performance.

However, the RF power amplifier typically includes non linearity and introduces unwanted distortions into its output signal. These distortions degrade communications, degrade efficiency and negatively impact performance. Additionally, intermodulation of input signal components can occur and cause undesirable interference. The intermodulation products can also extend outside the allowed bandwidth and cause undesirable interference and violate transmitting licensing and regulatory spectral emission requirements.

One technique to reduce the RF power amplifier introduced distortions is to apply a predistortion the to the amplifier input signal. The predistortion attempts to compensate for the amplifier-introduced distortions and improve the linearity of the cascade consisting of pre-distorter and RF power amplifier. The typical algorithms used for predistortion are intended to tune their parameters and minimize the total error between the desired reference signal and an observed signal. However, the amount or degree of linearization actually achieved can vary substantially according to both instantaneous characteristics of the reference signal being pre-distorted and the amplifier's transfer characteristic.

DETAILED DESCRIPTION

Figure 1:
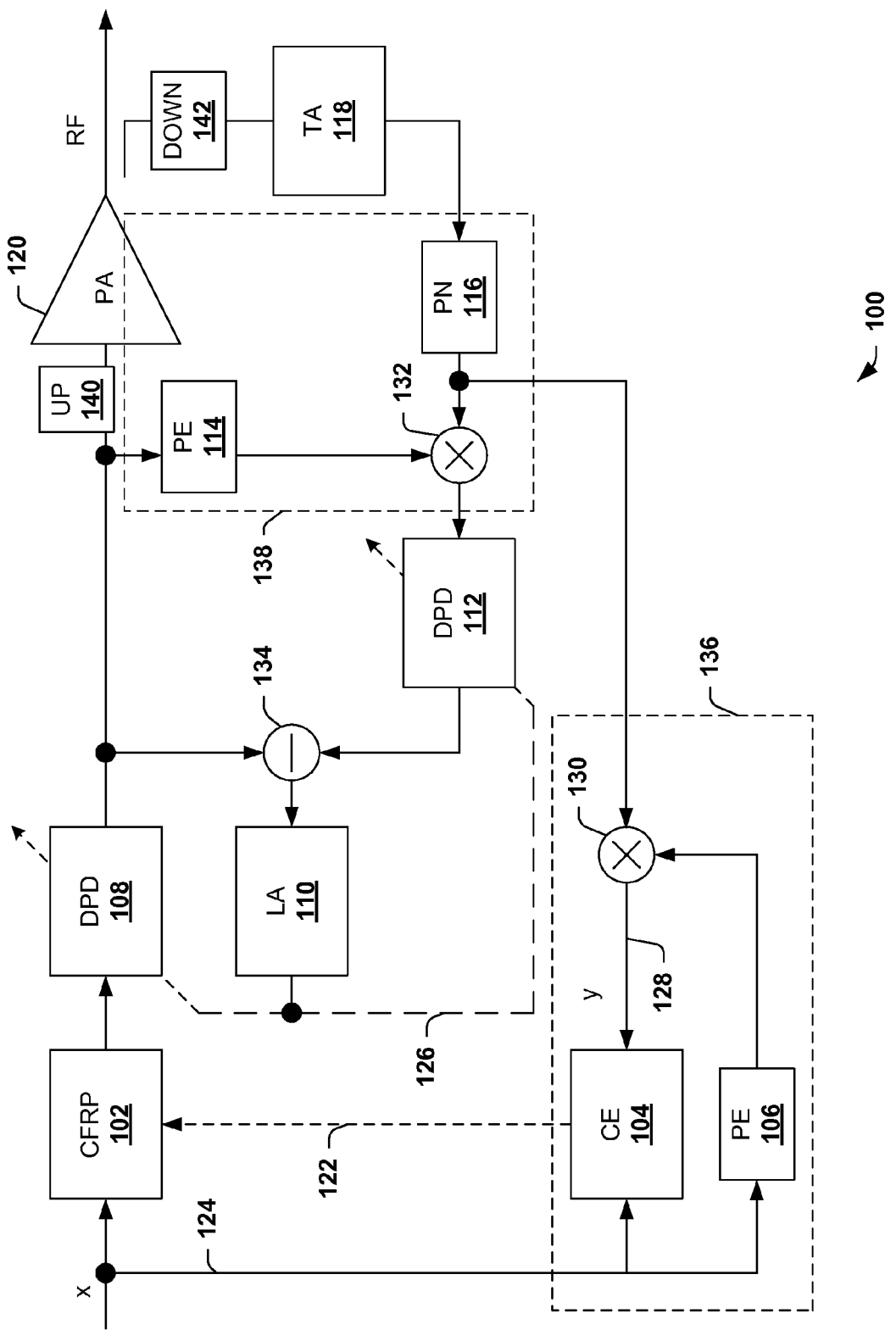
FIG. 1 is a block diagram illustrating a non-linear pre-distortion engine that mitigates in band and out of band distortions.

The present invention will now be described with reference to the attached drawing figures, wherein like reference numerals are used to refer to like elements throughout, and wherein the illustrated structures and devices are not necessarily drawn to scale.

Systems, methods, devices and embodiments are provided that implement pre-distortion for an RF power amplifier that uses adaptive tuning of a crest factor reduction processor in combination with a digital pre-distorter. These can be used in a variety of applications that include non-linear pre-distortion engines (NLPEs) for applications including, but not limited to, power amplifiers in wireless base stations, line drivers in wireline transceivers, electrical to optical converters for optical fiber communication transceivers, power amplifier test and characterization equipment, and the like.

A list of abbreviations used hereinafter:
ACPR Adjacent Channel Power Ratio
AM-AM Amplitude Modulation-Amplitude Modulation
CE Compression Estimator
CFRP Crest-Factor Reduction Processor
DPD Digital Pre-Distorter
EVM Error Vector Magnitude
NLPE Non-Linear Pre-distortion Engine
PE Peak Estimator
PN Peak Normalizer
SEM Spectral Emission Mask
TA Time Alignment RF power amplifiers typically exhibit non-linearity over at least portions of their range of operating frequencies and/or power levels. The non-linearity of a power amplifier introduces unwanted distortions into its output signal. The unwanted distortions include out-of-band distortions and in-band distortions. These unwanted distortions, especially in-band distortions, degrade communications, degrade efficiency and negatively impact performance. The out of band distortions typically result from intermodulation of input signal components. The intermodulation products can also extend outside the allowed bandwidth and cause undesirable interference and violate transmitting licensing and regulatory spectral emission requirements.

The examples described herein can be used to address a number of challenges that other linearity pre-distortion systems do not. Sufficient out of band suppression, typically quantified in terms of adjacent channel power ratio (ACPR) and spectral emission mask (SEM), is achieved. In band distortion is maintained below a specified level, which is typically characterized in terms of an error vector magnitude (EVM) constraint. Selected output power is maintained while avoiding excessive signal peaks at the non-linear pre-distortion engine (NLPE) output and the RF power amplifier input.

FIG. 1 is a block diagram illustrating a non-linear pre-distortion engine (NLPE) 100 that mitigates in-band and out-of-band distortions. The engine 100 is a closed loop complex baseband engine and uses an indirect learning architecture. It is appreciated that the NLPE 100 is provided in a simplified format and that other components can be employed.

Generally, the engine 100 includes a compression ratio estimate portion 136 and a peak power portion 138. The compression ratio estimate portion 136 generates an estimate of the compression ratio caused by a linearization process. The peak power portion 138 is configured to maintain a constant peak power for an input to a power amplifier.

In particular, the NLPE 100 includes a crest factor reduction processor (CFRP) 102, a compression estimator 104, a peak estimator 106, a first digital pre-distorter (DPD) 108, a learning algorithm component 110, a second or post digital pre-distorter (DPD) 112, a second peak estimator 114, a peak normalizer 116, a time alignment (TA) component 118, a non-linear power amplifier 120, an up-conversion component 140 and a down-conversion component 142.

The engine 100 receives an input signal x and generates an RF signal as its output. The input signal x typically includes modulation components, such as phase modulation, amplitude modulation and the like that convey information. The RF signal can be used for transmission to another device or component external to the engine 100.

The CFRP 102 is configured to reduce a crest factor of the input signal x and provide the reduced signal at its output. The output of the CFRP 102 is referred to as a crest factor reduced signal and is provided to an input of the first DPD 108. The CFRP 102 is configured to fulfill requirements, such as error vector magnitude (EVM) and adjacent channel power ratio (ACPR) requirements. Typically, the EVM is reduced to or below a threshold value as required. The EVM can be specified in regulatory requirements. Similarly, the ACPR is also reduced to or below a threshold value.

The first DPD 108 receives the crest factor reduced signal from the CFRP 102 and is configured to apply a pre-distortion and provide a pre-distorted signal at its output. The pre-distorted signal is provided as an input to the power amplifier 120. Generally, the DPD 108 applies pre-distortions to compensate for non-linearity distortion introduced by the power amplifier 120. It is noted that the up-conversion component 140 up converts the pre-distorted signal to an RF band prior to being provided to the input of the power amplifier 120.

The CFRP 102 ensures that the crest factor of an input of the DPD 108 is set to or below an initial value—the peak to average power ratio (PAPR), referred to as $PAPR_{in}$, during an initial phase where t<T and T represents a duration of the initial phase. Additionally, the DPD 108 leaves its input signal unaltered during the initial phase. Thus, the DPD 108 passes the crest factor reduced signal as the pre-distorted signal.

The output of the power amplifier 120, the RF signal, is recorded, time aligned with the input signal x, and scaled by mixer 130 to obtain a feedback signal y, also referred to as a feedback or result signal. The compression estimator 104 uses the feedback signal y and the input signal x to generate or yield an estimate of an average power difference between the input signal x and the feedback signal y. This estimated power difference $\Delta\hat{P}$ (also referred to as compression estimate) is equal to the power drop caused by the real power amplifier due to compression compared to a perfectly linear power amplifier. The compression estimate is shown as $\Delta\hat{P}$ of the compression ratio $$\Delta P = \frac{\bar{P}_{out}}{\bar{P}'_{out}}.$$

$$\Delta\hat{P} = \frac{\|x\|_2}{\|y\|_2} = \frac{\sum_k |x_k|^2}{\sum_k |y_k|^2}$$

where x is the input signal, y is the feedback signal and k is the number of samples.

As described above, the input peak-to-average-power ratio during the initial phase is $$PAPR_{in} = \frac{\hat{P}_{in}}{\bar{P}_{in}}.$$

Automatic peak scaling makes sure that the peak power before linearization (denoted $\hat{P}_{in}$) is equal to the peak power after linearization (denoted $\hat{P}_{in}'$).

The compression estimate $\Delta\hat{P}$ 122 is provided to the CFRP 102. After the initial phase (t≥T), the CFRP 102 is configured to reduce the envelope-peak $$\|x\|_\infty = \max_k |x_k|$$

of its input x by $\Delta\hat{P}$ yielding a crest factor $$PAPR'_{in} = \frac{PAPR_{in}}{\Delta P}.$$

Additionally, the CFRP 102 spectrally shapes the resulting distortion such that requirements, such as EVM and ACPR requirements, are complied with. In one example, the CFRP 102 is configured to estimate the spectral shape of the input x in order to ensure proper spectral shaping of the distortion.

The peak estimator 106 facilitates generation of the feedback signal (y) 128 used by the compression estimator 104. The peak estimator 106 operates on a block or stream of complex valued baseband samples. An envelope magnitude is determined for the block of samples. The real-valued and positive envelope block is interpolated by a factor K in order to capture peak re-growth effects. Then, the maximum value of the oversampled block is tracked yielding a peak estimate x. Additional details on the operation of and configuration of a suitable peak estimator are shown below.

The time alignment component 118 is configured to receive a coupled version of the RF output signal and time align the output signal with the input signal x. The coupled version of the RF output signal has been down converted from an RF frequency to baseband by the down-conversion component 142. The peak normalizer 116 is configured to receive the time aligned RF output signal and to normalize the signal with respect to its peaks. The peak normalizer 116 provides its output as a peak normalized signal, which is provided to the multiplier 132 and the multiplier 130.

The peak normalized signal can be shown as:

$$\tilde{x} = \frac{x}{\|x\|_\infty} = \frac{x}{\max_k |x_k|}$$

where x is the input signal and the peak normalizer 116 uses k samples.

The peak normalized signal is provided to the multiplier 130, wherein the output of the peak estimator 106 is combined with the peak normalized signal to generate the feedback y. Additionally, the peak normalized signal is provided to the multiplier 132, where it is combined with a second peak estimator signal from the second peak estimator and provided to the second DPD 112.

The first DPD 108 generates the pre-distorted signal and the second DPD 112 generates a pre-distorted feedback signal based at least partly on the peak normalized output signal. A subtraction component 134 is configured to combine the pre-distorted signal and the pre-distorted feedback signal and provide the combined signal to the learning algorithm component 110.

The learning algorithm component 110 is configured to generate pre-distortion parameters 126 based on the combined signal from the subtraction component 134. The pre-distortion parameters 126 are provided to both the first DPD 108 and the second DPD 112 so both provide the same pre-distortion to their input signals. As a result, the pre-distorted signal is used as the input to the power amplifier 120 and has a substantially constant peak power.

Figure 2:
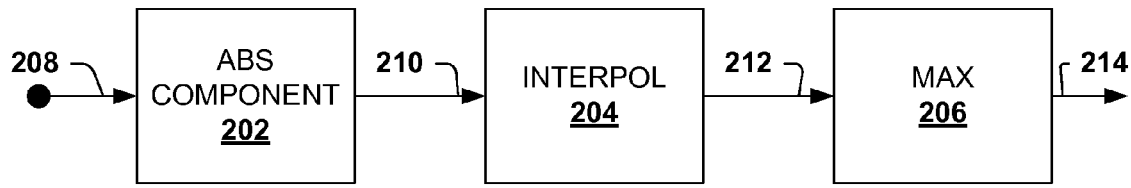
FIG. 2 is a block diagram illustrating a peak estimator.

FIG. 2 is a block diagram illustrating a peak estimator 200. The peak estimator 200 can be used, for example, in the system 100 as components 106 and/or 114. The peak estimator 200 is provided for illustrative purposes and it is appreciated that variations and/or implementations are permitted.

The peak estimator 200 includes an absolute value component 202, an interpolator 204 and a max function component 206. The absolute value component 202 receives a signal 208, such as the input signal x, and performs an absolute value on the signal and generates its absolute value as an output signal 210. Thus, the output signal 210 is always a positive value.

The interpolator 204 samples and oversamples the signal 210 based on K samples. The signal 210 typically is considered to have blocks specified by a duration and/or number of symbols and the oversampling is performed on a block of the signal 210. Thus, for an example block, if K=4, there are 4 samples and 9 interpolated samples for a total of 13 oversamples. The oversamples are provided as an output 212 of the interpolator.

The max function component 206 reviews the oversamples 212 for the block and identifies a maximum or peak value. This peak value is provided as a peak estimate 214. A revised or new estimate is determined for each additional block.

Figure 3:
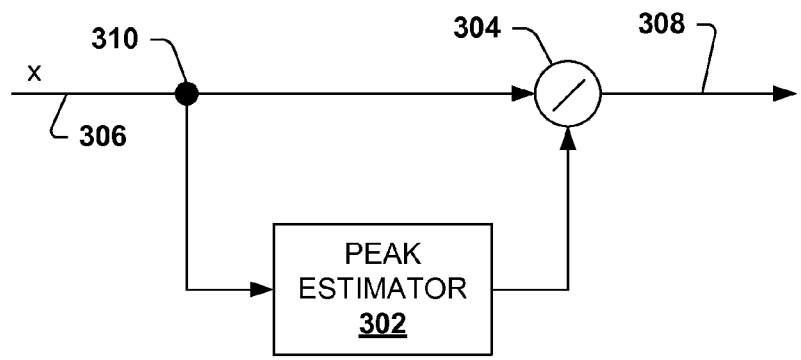
FIG. 3 is a block diagram illustrating a peak normalizer.

FIG. 3 is a block diagram illustrating a peak normalizer 300. The peak normalizer 300 is an example of a suitable peak normalizer that can be used in the system 100 as component 116, described above. It is appreciated that other implementations and variations for the peak normalizer are contemplated.

The peak normalizer 300 receives an input signal 306, such as x, and generates a normalized signal 308 at its output. The normalized signal 308 typically falls within a range of values with an upper bound at about 1 due to the normalization. The normalization is for one or more blocks, in one example.

The peak normalizer 300 includes an input terminal 310, a divider 304 and a peak estimator 302. The input terminal 310 is configured to receive the input signal 306. In one example, the input signal 306 is a coupled version of an RF output signal that has been time aligned with another signal. The peak estimator 302 is configured to receive the input signal 306 and generate a peak estimate over one or more blocks of data of the input signal 306. The peak estimate is provided as a peak output signal to the divider 304.

The divider 304 divides the input signal 306 by the peak estimate from the estimator 302. As a result, the divider 304 generates and provides the normalized signal 308 at its output. The divider 304, in one example, operates on samples of the input signal and produces normalized values for each sample, divided by the peak estimate. The divider typically uses the same peak estimate per block of the input signal 306.

In one variation, a multiplier is used instead of the divider 304 and the peak estimate is inverted prior to multiplying.

Figure 4:
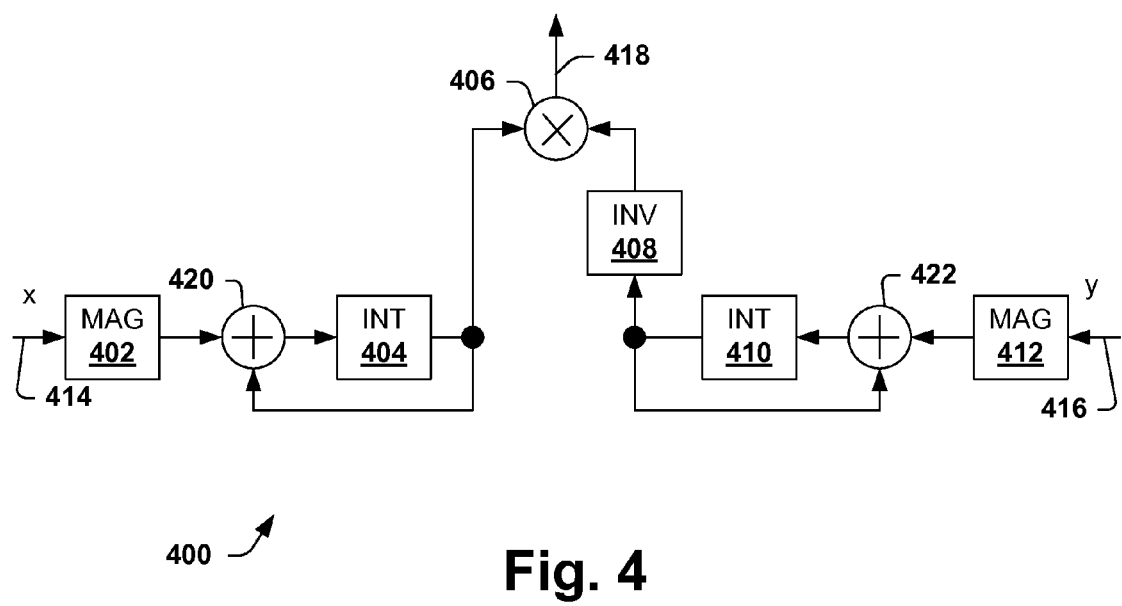
FIG. 4 is a diagram illustrating a compression estimator.

FIG. 4 is a diagram illustrating a compression estimator 400. The compression estimator is provided as an example of a suitable compression estimator that can be used in the system 100, described above. It is appreciated that other implementations and variations thereof are contemplated.

The compression estimator 400 provides a comparison of a first signal 414 and a second signal 416. The comparison is provided in the form of a ratio and is provided as a compression estimate 418. The compression estimate 418 is based on one or more blocks of the signals 414 and 416.

Compression with regards to a power amplifier, such as amplifier 120 shown above, refers to a region where the amplifier output signal no longer increases linearly with the amplifier input signal. Beyond a compression threshold, the incremental gain in the amplifier output signal starts decreasing for given amplifier input values. The amplifier output signal compresses towards the input signal.

The compression estimator 400 generates the compression estimate 418, which allows a CFRP component to reduce the crest factor of a signal by the compression estimate 418 and mitigate unwanted compression.

The compression estimator 400 generates an average power for the first signal 414 and an average power for the second signal 416 and then divides the first average power by the second average power to generate the compression estimate 418. In one example, the first signal 414 is the input x and the second signal 416 is the feedback signal y described above with regard to FIG. 1.

A first side of the compression estimator 400 includes a first magnitude component 402, a first summation component 420, and a first integrator 404. The first side determines an average power for the first signal 414. The magnitude component 402 squares its input, which always results in a positive value. Its output is added to an output of the first integrator 404 at the summation component 420. An output of the summation component 420 is integrated by the first integrator 404. The output of the first integrator is provided to a multiplier/combiner 406 and represents an average power of the first signal 414 and is also provided to the first summation component 420 as feedback.

A second side of the compression estimator 400 includes a second magnitude component 412, a second summation component 422, a second integrator 410, and an inverse component 408. The second side determines an average power for the second signal 416. The second magnitude component 412 squares its input, which results in a positive value. Its output is added to an output of the second integrator 410 at the second summation component 422. An output of the summation component 422 is integrated by the second integrator 410. The output of the second integrator 410 is inverted by component 408 and then provided to a multiplier/combiner 406 and represents an average power of the second signal 416. The output of the second integrator 410 is also provided to the second summation component 422 as feedback.

Figure 5:
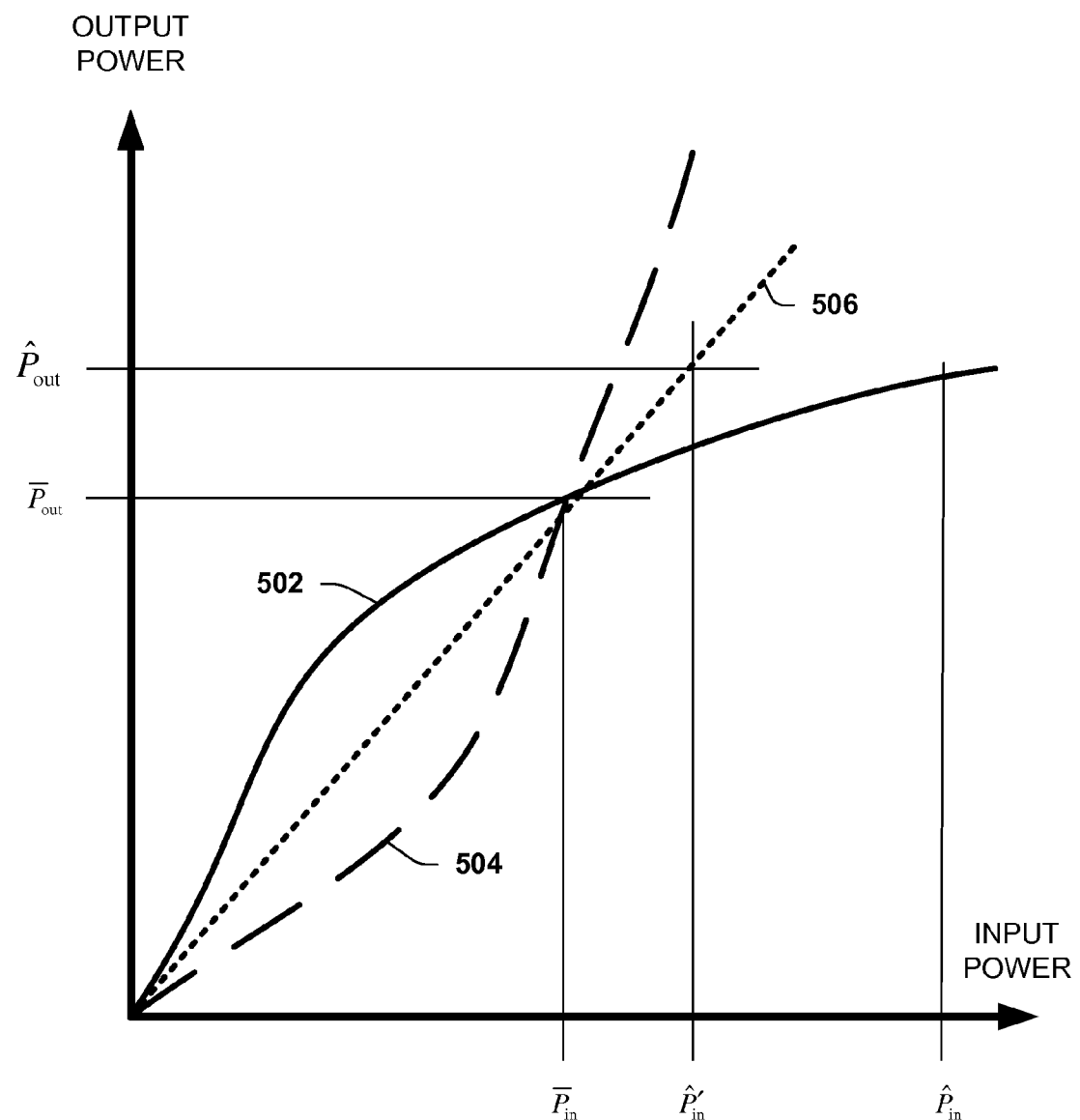
FIG. 5 is a graph illustrating example power curves for a power amplifier using a pre-distortion approach based on constant average power scaling.

FIG. 5 is a graph 500 illustrating example characteristics of a power amplifier using a pre-distortion approach based on constant average power scaling. The curves are examples of a pre-distortion engine that maintains constant average power before linearization (that is, before and during the initial phase, t<T) and after linearization (t>=T). The amplifier characteristic is described in form of amplitude modulation to amplitude modulation (AM-AM) curves.

The graph 500 includes an x-axis that represents increasing input power to a power amplifier and a y-axis that represents increasing output power from the power amplifier. The power amplifier is a type used, for example, in RF communications and the like. The curves or lines depict output power values for given input power values.

Line 502 represents the AM-AM behavior of the power amplifier (without linearization). It can be seen that the behavior is non-linear. This is an example of typical power amplifier behavior without correction. Line 504 represents behavior from a non-linear pre-distorter. The predistortion 504 attempts to compensate for distortions introduced by the power amplifier.

The combination of the predistortion and the AM-AM behavior is represented by line 506. The combination 506 is the result of the power amplifier characteristics and the non-linear pre-distortion engine. It can be seen that the combination 506 is substantially linear. The combination yields the same average power amplifier output power $\overline{P}_{out}$. The pre-distortion 504 counters compression exhibited by the power amplifier 502 by exhibiting expansive behavior.

This approach depends on a learning algorithm that determines the coefficients or parameters for the pre-distortion. Estimation errors, such as measurement noise, numerical noise, suboptimal model choice, imperfect equipment configuration, parameter drift and the like can creates severe expansion characteristics at upper power amounts. These unwanted effects are referred to as pre-distorter blow up, avalanche effect and the like and can have deleterious consequences for the power amplifier and system/device it is in. Additionally, there is no control over peak power of the pre-distortion 504 and/or of the power amplifier using this approach.

Figure 6:
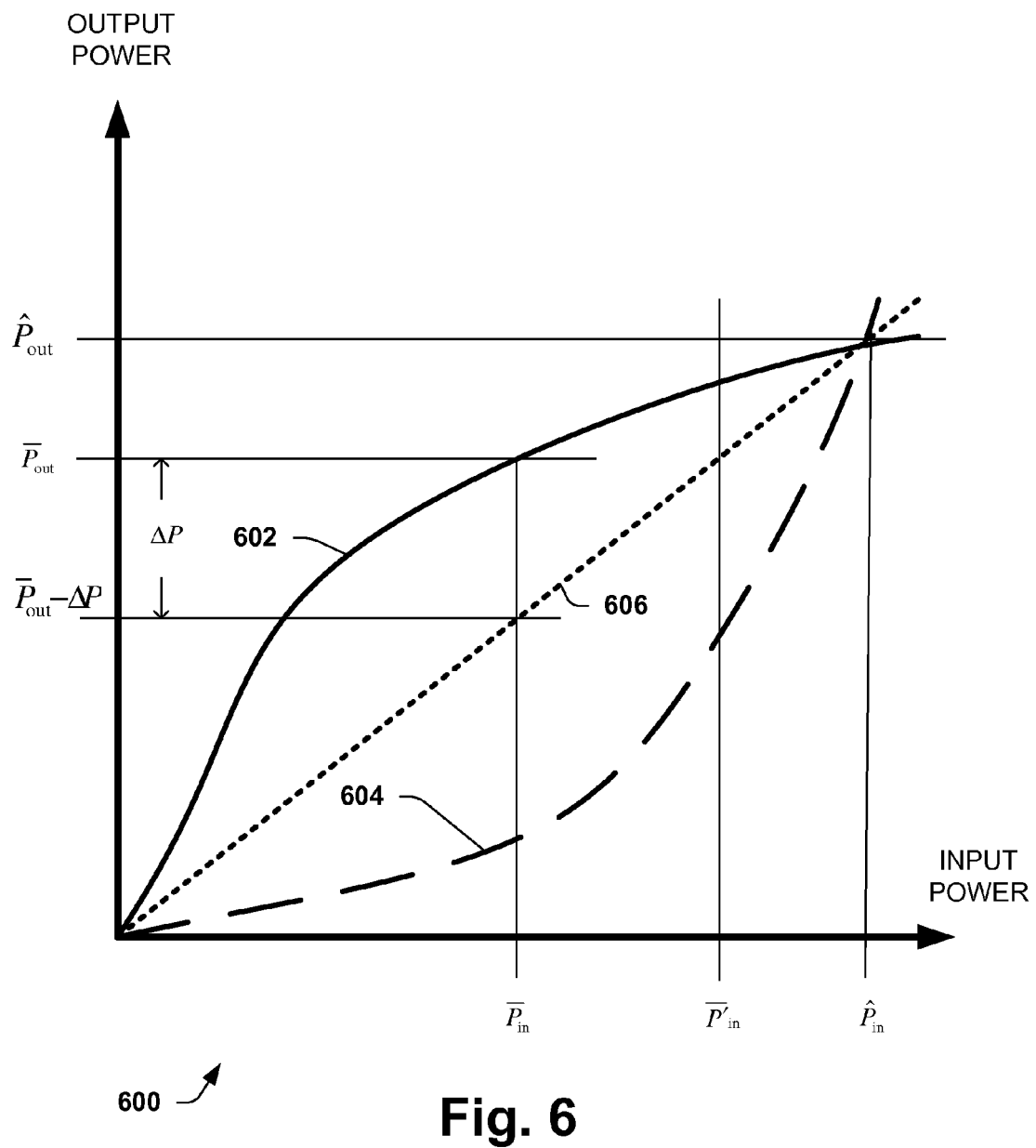
FIG. 6 is a graph illustrating example power curves for a power amplifier using a pre-distortion approach based on constant peak power.

FIG. 6 is a graph 600 illustrating example power curves for a power amplifier using a pre-distortion approach based on constant peak power. The curves are examples associated with a pre-distortion engine that maintains a constant peak power. The curves are examples of curves that can be obtained using the system 100 and variations thereof.

The graph 600 includes an x-axis that represents increasing input power to a power amplifier and a y-axis that represents increasing output power from the power amplifier. The power amplifier employed is of a type used in RF communications and the like, such as the power amplifier 120, described above.

Line 602 represents behavior of the power amplifier (without linearization). It can be seen that the behavior is again non-linear. This is an example of typical power amplifier exhibiting non-linear behavior without correction. Line 604 represents behavior from a non-linear pre-distorter. The pre-distortion 604 compensates for distortions introduced by the power amplifier.

The combination of the pre-distortion and the power amplifier behavior is represented by line 606. The combination 606 is the result of the power amplifier characteristics and the non-linear pre-distortion engine. It can be seen that the combination 606 is substantially linear.

The combination 606 yields a constant peak power $\hat{P}_{out}$ at the amplifier output. Peak input power is denoted as $\hat{P}_{in}$ and average input power is denoted as $\overline{P}_{in}$. The peak to average power ratio during the initial phase, where t<T, is $$PAPR_{in} = \frac{\hat{P}_{in}}{\overline{P}_{in}}.$$

During the initial phase, as described above, no pre-distortion or linearization is applied. Automatic peak scaling by the CFRP makes sure the peak power before linearization, denoted $\hat{P}_{in}$, is equal to the peak power after linearization denoted $\hat{P}_{in}'$. After the initial phase, the combination or chain 606, which includes a combination of 602 and 604, is substantially linear yielding the same peak power $\hat{P}_{out}$ a the power amplifier output. The peak power is kept constant, so the average power drops by ΔP from $\overline{P}_{out}$ to $\overline{P}_{out}$-ΔP.

Figure 7:
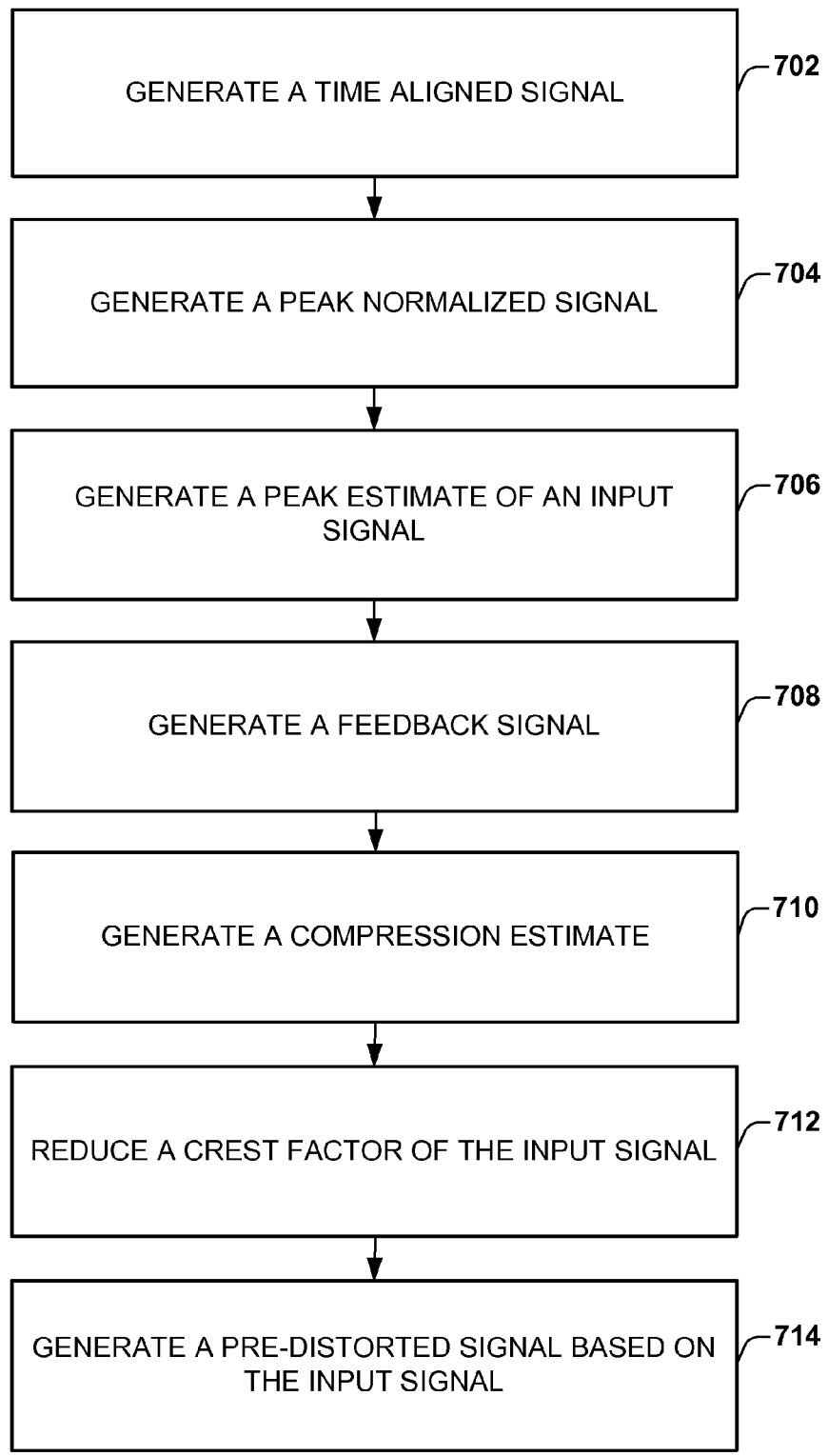
FIG. 7 is a flow diagram illustrating a method of operating a non-linear pre-distortion engine having constant peak power.

The graph 600 is depicted with a vertical line at the average power amplifier input $\overline{P}_{in}$. Under the constant average power approach, the compensation 606 would lie through an intersection of the average power amplifier input $\overline{P}_{in}$ and the average power amplifier output $\overline{P}_{out}$. However, using the constant peak power approach, the compensation 606 is shifted by the power drop ΔP as shown. As a result, linearity of the chain consisting of pre-distorter and power amplifier in this approach is maintained throughout the range while keeping control of the peak power at the power amplifier input (or equivalently, the pre-distorter output) and thus avoiding undesired avalanche or pre-distorter blow-up effects. FIG. 7 is a flow diagram illustrating a method 700 of operating a non-linear pre-distortion engine having constant peak power. The method applies a pre-distortion such that a substantially constant peak power is used.

The method 700 begins at block 702 where a time aligned signal is generated from an RF output signal from a power amplifier. A coupled version of the RF output signal is typically used. The RF output signal is generated by the power amplifier, which has non-linear characteristics. A time alignment component aligns the time aligned signal with another signal, such as an input signal.

A peak normalized signal is generated by a peak normalizer at block 704. The peak normalizer identifies a max or peak value or estimate for a number of samples of the time aligned signal. Then, the samples are divided by a max value of the number of samples to obtain the peak normalized signal. Typically, the peak normalized signal has values less than or equal to one.

A peak estimator generates a peak estimate of the input signal at block 706. The input signal is a signal with modulation components, such as amplitude modulation components, that convey information. The peak estimate is a max or peak value of a number of values. Typically, the number of values comprise a block. The size of the block can vary.

A feedback signal is generated at block 708 as a combination of the peak normalized signal and the peak estimate. It is noted that the peak normalized signal is based on the RF output signal and the peak estimate is based on the input signal. A summation component is used to combine the signals into the feedback signal.

A compression estimator generates a compression estimate at block 710. The compression estimate is based on the input signal and the feedback signal. In one example, the compression estimate is a ratio of an average power of the input signal divided by an average power of the feedback signal. Examples of suitable compression estimators are described above.

A crest factor of the input signal is reduced by a crest factor reduction processor at block 712 based on the compression estimate. The crest factor reduction processor generates a reduced crest factor signal as an output. The reduced crest factor signal has a reduced crest factor according to the compression estimate and/or other requirements, such as EVM and the like.

A digital pre-distorter generates a pre-distorted signal from the crest factor reduced signal according to pre-distortion parameters to generate a pre-distorted signal at block 714. An example of the pre-distorted signal is given by line 604 of FIG. 6. The pre-distorted signal is modified or distorted to compensate for nonlinearity of the power amplifier.

The power amplifier then generates the RF output signal from the pre-distorted signal. Due to the pre-distortion, the RF output signal is generated with a substantially linear relationship by the chain to the input signal.

Additionally, a second digital pre-distorter generates a second pre-distorted signal based on the peak normalized signal. A learning algorithm component generates the pre-distortion parameters based on the pre-distorted signal and the second pre-distorted signal. The pre-distorted signal and the second pre-distorted signal should be substantially similar. Differences therein are noted by the learning algorithm component, which alters or adjusts the pre-distortion parameters to compensate.

While the method is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

It is appreciated that the claimed subject matter may be implemented as a method, apparatus, or article of manufacture using standard programming and/or engineering techniques to produce software, firmware, hardware, or any combination thereof to control a computer to implement the disclosed subject matter (e.g., the systems, arrangements and the like shown in FIGS. 1, 2, etc., are non-limiting examples that may be used to implement the above methods). The term "article of manufacture" as used herein is intended to encompass a computer program accessible from any computer-readable device, carrier, or media. Of course, those skilled in the art will recognize many modifications may be made to this configuration without departing from the scope or spirit of the claimed subject matter.

A non-linear pre-distortion engine having constant peak power is disclosed. The engine includes a compression estimator, a crest factor reduction processor, a digital pre-distorter and a power amplifier. The compression estimator is configured to generate a compression estimate based on an input signal and a feedback signal. The feedback signal is based on an RF output signal. The crest factor reduction processor is configured to reduce a crest factor of the input signal to generate a crest factor reduced signal based on the compression estimate. The digital pre-distorter is configured to apply a pre-distortion to the crest factor reduced signal after an initial phase and generate a pre-distorted signal based on pre-distortion parameters. The power amplifier is configured to amplify the pre-distorted signal to generate the RF output signal. The operation of the chain consisting of pre-distorter and power amplifier is substantially linear and operates based on a constant peak power.

A compression estimator includes a first input, a first absolute value component, a first summation component and a first integrator. The first input is configured to receive a first signal. The first absolute value component is configured to generate a first absolute value of the first signal. The first summation component is configured to add the first absolute value to a first integrator output signal to generate a first summation signal. The first integrator is configured to integrate the first summation signal and generate the first integrator output signal. The first integrator output signal is an average power of the first input signal.

A method of operating a non-linear pre-distortion engine having constant peak power is disclosed. A time aligned signal is generated from an RF output signal. A peak normalized signal is generated by a peak normalizer. A peak estimate of an input signal is generated by a peak estimator. A feedback signal is generated as a combination of the peak normalized signal and the peak estimate. A compression estimate is generated as a ratio of an average power of the input signal and an average power of the feedback signal. A crest factor of the input signal is reduced to generate a crest factor reduced signal by a crest factor reduction processor according to the compression estimate.

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A non-linear pre-distortion engine maintaining constant peak power at its output, the engine comprising:
   a compression estimator configured to generate a compression estimate based on an input signal and a feedback signal, wherein the feedback signal is based on an RF output signal;
   a crest factor reduction processor configured to reduce a crest factor of the input signal to generate a crest factor reduced signal based on the compression estimate;
   a digital pre-distorter configured to apply a pre-distortion to the crest factor reduced signal after an initial phase and generate a pre-distorted signal based on pre-distortion parameters;
   a power amplifier configured to amplify the pre-distorted signal to generate the RF output signal, wherein the operation of the power amplifier is substantially linear and operates based on a constant peak power; and
   a multiplier and a peak estimator, wherein the peak estimator is configured to generate a peak estimate of the input signal and the multiplier is configured to generate the feedback signal at least partially based on the peak estimate.

2. The engine of claim 1, wherein the peak estimate is configured to generate the peak estimate using interpolation to identify a peak value over a block of samples.

3. The engine of claim 1, wherein the crest factor reduction processor is also configured to adjust the crest factor to fulfill requirements.

4. The engine of claim 3, wherein the requirements include error vector magnitude requirements.

5. The engine of claim 1, wherein the compression estimate is a ratio of an average power of the input signal and an average power of the feedback signal.

6. The engine of claim 1, further comprising a peak normalizer configured to normalize a time aligned RF output signal with respect to its peaks to generate a peak normalized signal from the RF output signal.

7. The engine of claim 6, where the multiplier is configured to combine the peak normalized signal with the peak estimate to generate the feedback signal.

8. A non-linear pre-distortion engine maintaining constant peak power at its output, the engine comprising:
- a compression estimator configured to generate a compression estimate based on an input signal and a feedback signal, wherein the feedback signal is based on an RF output signal;
- a crest factor reduction processor configured to reduce a crest factor of the input signal to generate a crest factor reduced signal based on the compression estimate;
- a digital pre-distorter configured to apply a pre-distortion to the crest factor reduced signal after an initial phase and generate a pre-distorted signal based on pre-distortion parameters;
- a power amplifier configured to amplify the pre-distorted signal to generate the RF output signal, wherein the operation of the power amplifier is substantially linear and operates based on a constant peak power; and
- a peak normalizer configured to generate a peak normalized signal based on the RF output signal.

9. The engine of claim 8, further comprising a multiplier configured to generate the feedback signal based on the peak normalized signal and a peak estimate.

10. The engine of claim 8, further comprising a multiplier configured to generate a feedback pre-distortion signal based on the peak normalized signal and a peak estimate of the pre-distorted signal provided to the power amplifier.

11. The engine of claim 10, further comprising a learning algorithm component and a second digital pre-distorter, wherein the second digital pre-distorter generates a second pre-distorted signal based on the pre-distortion parameters and the peak normalized signal and the learning algorithm component is configured to generate the pre-distortion parameters based on a combination of the pre-distorted signal and the second pre-distorted signal.

12. A non-linear pre-distortion engine maintaining constant peak power at its output, the engine comprising:
- a compression estimator configured to generate a compression estimate based on an input signal and a feedback signal, wherein the feedback signal is based on an RF output signal;
- a crest factor reduction processor configured to reduce a crest factor of the input signal to generate a crest factor reduced signal based on the compression estimate;
- a digital pre-distorter configured to apply a pre-distortion to the crest factor reduced signal after an initial phase and generate a pre-distorted signal based on pre-distortion parameters;
- a power amplifier configured to amplify the pre-distorted signal to generate the RF output signal, wherein the operation of the power amplifier is substantially linear and operates based on a constant peak power; and
- a time align component configured to time align a coupled version of the RF output signal into a time aligned signal and the feedback signal is at least partially based on the time aligned signal.

* * * * *